(12) United States Patent
Patel

(10) Patent No.: US 7,339,974 B2
(45) Date of Patent: Mar. 4, 2008

(54) TUNABLE SEMICONDUCTOR LASER

(76) Inventor: C. Kumar N. Patel, 1171 Roberto La., Los Angeles, CA (US) 90077

( * ) Notice: Subject to any disclaimer, the term of this patent is extended or adjusted under 35 U.S.C. 154(b) by 216 days.

(21) Appl. No.: 11/185,516

(22) Filed: Jul. 19, 2005

(65) Prior Publication Data

US 2005/0254529 A1  Nov. 17, 2005

Related U.S. Application Data

(63) Continuation of application No. 10/286,171, filed on Oct. 31, 2002, now Pat. No. 6,956,886.

(60) Provisional application No. 60/339,834, filed on Nov. 2, 2001.

(51) Int. Cl.
*H01S 3/08* (2006.01)

(52) U.S. Cl. .................. 372/99; 372/98; 372/103; 372/107; 372/108; 372/20

(58) Field of Classification Search ............... 372/20, 372/18, 23, 98, 99, 103, 107, 108
See application file for complete search history.

(56) References Cited

U.S. PATENT DOCUMENTS

| | | | |
|---|---|---|---|
| 3,498,693 A | 3/1970 | Fein et al. | |
| 3,872,407 A | 3/1975 | Hughes | |
| 4,092,659 A | 5/1978 | Ettenberg | |
| 4,671,603 A * | 6/1987 | McQuoid et al. | ............ 359/15 |
| 4,752,130 A | 6/1988 | George et al. | |
| 4,839,308 A | 6/1989 | Fye | |
| 4,896,325 A | 1/1990 | Coldren | |
| 4,920,541 A | 4/1990 | Baumgartner et al. | |
| 5,434,874 A | 7/1995 | Fouquet et al. | |
| 5,943,352 A | 8/1999 | Fee | |
| 5,970,190 A | 10/1999 | Fu et al. | |
| 6,041,071 A * | 3/2000 | Tayebati | ..................... 372/64 |
| 6,049,554 A | 4/2000 | Lang et al. | |
| 6,122,299 A | 9/2000 | De Mars et al. | |
| 6,205,159 B1 | 3/2001 | Sesko et al. | |
| 6,282,213 B1 | 8/2001 | Gutin et al. | |
| 6,295,308 B1 | 9/2001 | Zah | |
| 6,671,295 B2 * | 12/2003 | Gutin | ......................... 372/20 |
| 6,718,092 B2 | 4/2004 | Wang | |
| 6,724,797 B2 | 4/2004 | Daiber | |

(Continued)

*Primary Examiner*—Minsun Oh Harvey
*Assistant Examiner*—Kinam Park
(74) *Attorney, Agent, or Firm*—Cislo & Thomas, LLP

(57) ABSTRACT

A tunable semiconductor laser includes gain medium, wavelength-selective element and a laser mode matching element. The wavelength-selective element comprises a first light absorbing plate operatively coupled to the laser mode matching element and provided with an array of high reflectivity mirrors as well as a second light absorbing plate with an array of narrow band pass filter mirrors operatively coupled to the high reflectivity mirror array of the first plate. The narrow band pass filter mirror array is disposed over a respective array of apertures in the second plate. The wavelength-selective element also comprises a light reflective plate with an array of retroreflectors and a third light absorbing plate with an array of apertures operatively disposed between the aperture array of the second plate and the retroreflector array. Activation of a selected retroreflector results in light of a corresponding wavelength being coupled back to the gain medium through the laser mode matching element and the first, second and third plates.

24 Claims, 3 Drawing Sheets

U.S. PATENT DOCUMENTS 6,728,434 B2 * 4/2004 Flanders .................. 385/18
2002/0054424 A1 5/2002 Miles 2002/0181849 A1 12/2002 Flanders

* cited by examiner

TUNABLE SEMICONDUCTOR LASER

CROSS-REFERENCE TO RELATED APPLICATIONS

This patent application is a continuation of U.S. patent application Ser. No. 10/286,171, filed Oct. 31, 2002, now U.S. Pat. No. 6,956,886, which claims the benefit of U.S. Provisional Patent Application Ser. No. 60/339,834, filed Nov. 2, 2001. The content of these two patent applications are incorporated herein in their entirety by reference.

BACKGROUND

Wavelength division multiplex systems require semiconductor lasers that are accurately set at the ITU (International Telecommunications Union) frequencies for proper operation. Conventional semiconductor lasers used for such systems are preset to requisite wavelengths by incorporating a distributed Bragg grating in or near the active region of the laser. The manufacturing technology is sufficiently complex for precise wavelength setting. Therefore, yields of lasers at the precise and guaranteeable ITU wavelengths are low, leading to high manufacturing costs.

Additionally, once a laser of a given wavelength is fabricated, its wavelength cannot practically be changed, except for very small, but undesirable variations, resulting from temperature or current tuning of the dielectric constant or the dimension of the grating. Moreover, as lasers age, undesirable wavelength may occur as a result of prolonged usage.

Wavelength variations, either due to aging or due to imprecise manufacturing, may degrade the performance of a system since the Dense Wavelength Division Multiplex (DWDM) wavelengths, set by ITU standards, have to propagate through multiplexers and/or demultiplexers (or other wavelength sensitive elements) which are set to precise wavelengths using passive filters or other wavelength discriminating components. Consequently, such lasers often require repair and replacement.

Additionally, a laser is needed for each wavelength used, and some operations may require as many as 60 or more lasers. Thus, there is a need for a single laser component that can be tuned to generate any of the ITU wavelengths with precision and under software control.

Additionally, optical switches will allow any wavelength channel to be switched to any of the customers. In order to make sure that the return wavelength from a particular customer is the same as the wavelength received by the customer without the customer premises being stocked with all possible ITU wavelength lasers, it would be very desirable to have a single "laser" which can be tuned to the desired ITU wavelength precisely, quickly, and under system administrator's software control.

SUMMARY

Exemplary embodiments disclosed herein are generally directed to a tunable semiconductor laser.

In accordance with one aspect of the invention, the tunable semiconductor laser comprises a semiconductor gain medium, a laser tuning element configured to transmit light at discrete wavelengths and reflect light of respective non-transmitted wavelengths internally, a laser mode matching element operatively coupled between the semiconductor gain medium and the laser tuning element, and a retroreflector array optically aligned with the laser tuning element. The laser tuning element is adapted to output light of a selected wavelength and absorb light of all other wavelengths upon activation of a corresponding retroreflector. The selected wavelength light output is coupled back to the semiconductor gain medium via the laser mode matching element.

In accordance with another aspect of the invention, the tunable semiconductor laser comprises a gain medium, a wavelength-selective element and a laser mode matching element operatively coupled between the gain medium and the wavelength-selective element.

The wavelength-selective element comprises in turn a first light absorbing plate operatively coupled to the laser mode matching element and provided with an array of high reflectivity mirrors. The high reflectivity mirror array faces away from the laser mode matching element. The wavelength-selective element also comprises a second light absorbing plate with an array of narrow band pass filter mirrors operatively coupled to the high reflectivity mirror array of the first plate. The narrow band pass filter mirror array is disposed over a respective array of apertures in the second plate. Each of the narrow band pass filter mirrors is adapted to transmit light of a particular wavelength and reflect light of all other wavelengths.

The wavelength-selective element further comprises a light reflective plate with an array of retroreflectors. Each of the retroreflectors is capable of activation. The wavelength-selective element also comprises a third light absorbing plate with an array of apertures operatively disposed between the aperture array of the second light absorbing plate and the retroreflector array of the light reflective plate. Activation of a selected retroreflector results in light of a corresponding wavelength being coupled back to the gain medium through the laser mode matching element and the first, second and third light absorbing plates.

In accordance with yet another aspect of the invention, a method for tuning a laser having a semiconductor gain medium and a laser mode matching element comprises the steps of:

(a) disposing an array of high reflectivity mirrors away from the laser mode matching element;

(b) disposing an array of narrow band pass filter mirrors over a first array of apertures, whereby each of the narrow band pass filter mirrors is adapted to transmit light of a particular wavelength and reflect light of all other wavelengths;

(c) optically aligning the narrow band pass filter mirror array to the high reflectivity mirror array;

(d) providing an array of retroreflectors, whereby each of the retroreflectors is capable of activation;

(e) operatively disposing a second array of apertures between the first aperture array and the retroreflector array;

(f) optically aligning the retroreflector array to the narrow band pass filter mirror array via the first and second aperture arrays, whereby the retroreflector array receives light at discrete wavelengths; and (g) activating a particular retroreflector to cause light of a selected wavelength to be coupled back to the semiconductor gain medium through the laser mode matching element, the first and second aperture arrays, the narrow band pass filter mirror array and the high reflectivity mirror array.

These and other aspects of the invention will become apparent from a review of the accompanying drawings and the following detailed description of the invention.

BRIEF DESCRIPTION OF THE DRAWINGS

The present invention is generally shown by way of reference to the accompanying drawings in which.

DETAILED DESCRIPTION

The detailed description set forth below in connection with the appended drawings is intended as a description of exemplary embodiments and is not intended to represent the only forms in which the exemplary embodiments may be constructed and/or utilized. The description sets forth the functions and the sequence of steps for constructing and operating the exemplary embodiments in connection with the illustrated embodiments. However, it is to be understood that the same or equivalent functions and sequences may be accomplished by different embodiments that are also intended to be encompassed within the spirit and scope of the present invention.

Some embodiments of the present invention will be described in detail with reference to a tunable semiconductor laser, as generally shown in FIGS. 1-5. Additional embodiments, features and/or advantages of the invention will become apparent from the ensuing description or may be learned by practicing the invention. In the figures, the drawings are not to scale with like numerals referring to like features throughout both the drawings and the description.

Figure 1:
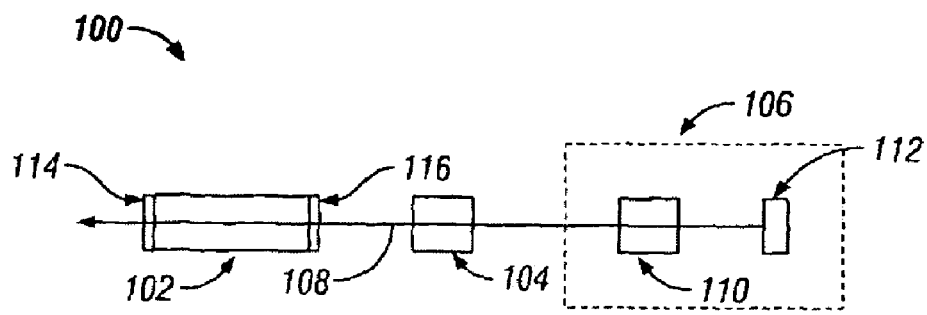
FIG. 1 schematically shows a semiconductor laser which can be tuned to discrete ITU frequencies in accordance with the general principles of the present invention.

FIG. 1 shows an overall schematic of a step tunable (i.e., tunable to preset ITU wavelengths) semiconductor laser 100, comprising a wavelength selection element 106. The laser 100 further includes other components typical to a laser system, such as a semiconductor laser chip 102, and a mode matching element 104. The chip 102 may be fabricated, for example, using traditional growth and processing technologies appropriate for communication band wavelength lasers. One face of the chip 102 is coated with appropriate broadband partially reflective multilayer (or otherwise) coating 114 for coupling the laser power out from the chip. The other face of the laser is coated with broadband totally anti-reflection coating 116 appropriate for the wavelengths of concern for the communication band.

Following the axis 108, along which lasing will take place, beyond the anti-reflection coated surface is the mode matching element 104 that matches the guided mode output emanating from the semiconductor laser chip to a free space propagating mode. The free space propagating mode is coupled into the wavelength selection element 106 which comprises a discrete wavelength transmission component 110 and an externally controllable reflection component 112.

The wavelength transmission component 110 is a transmission device whose transmission frequencies are selectable. The reflection component 112 allows the discreet wavelengths to be selected under an external control and completes the laser resonator path at the selected wavelength.

By changing the characteristics of the wavelength selection element 106, the same path can become a resonator for a different wavelength. Thus, the same laser chip can be made to generate any of the laser wavelengths that are preset to the ITU frequencies under external control of the wavelength selection element 106.

Figure 2:
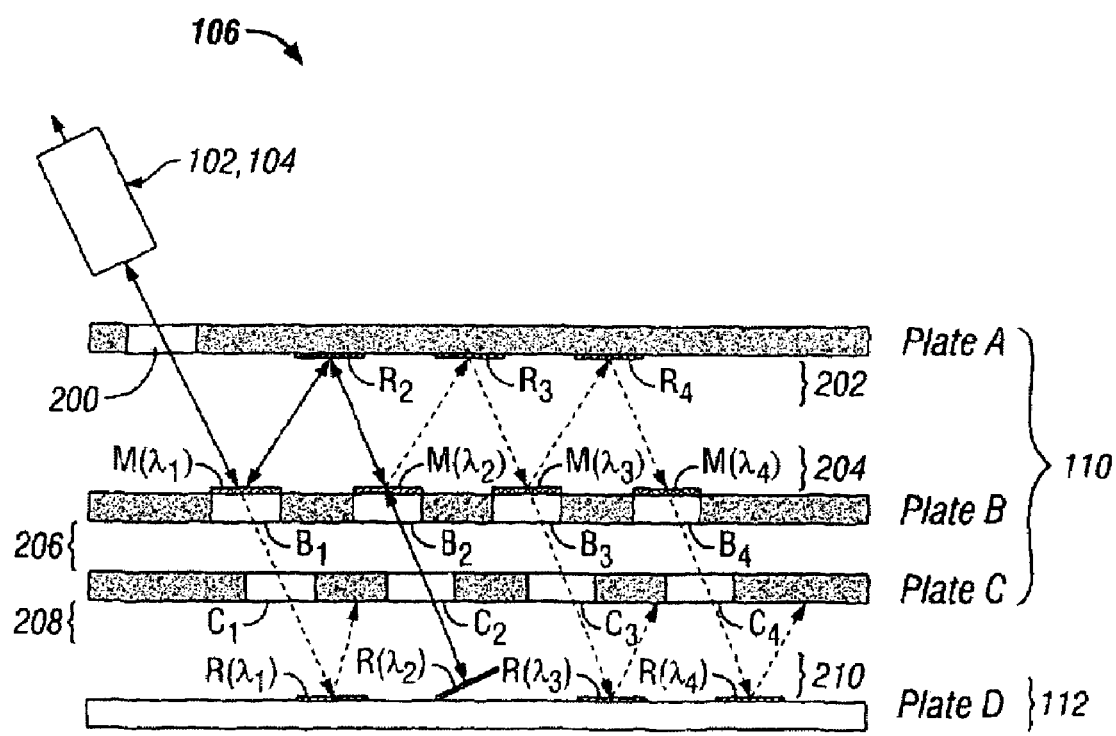
FIG. 2 schematically illustrates the operation of a wavelength selection element according to one embodiment of the present invention, whereby a retroreflector R ($\lambda_2$) of the wavelength selection element is in an activated position.

FIG. 2 shows one possible embodiment for the wavelength selection element 106 which can be digitally operated. This comprises three flat parallel plates, labeled "A," "B," and "C," forming the transmission component 110, as indicated in the figure, and a reflection component 112 (labeled as Plate "D") comprising a 1×N array of retroreflectors, which may be broadband high reflectivity MEM mirrors. An array of 1×4 is shown in the figure for simplicity; however, N may be any number corresponding to the desired number of selectable wavelengths.

Plate A has an aperture, 200 for coupling the collimated beam from the semiconductor chip 102 into the assembly, and an array 202 of broadband high reflectivity mirrors, $R_j \ldots R_N$, positioned on Plate A, on a side opposite the chip 102, as illustrated in the figure.

Plate B has an array 204 of 1×N narrow band pass filter mirrors $M(\lambda_1) \ldots M(\lambda_N)$, each mirror being capable of transmitting a particular wavelength, $\lambda_n$, where n=1, 2, 3 . . . N, and reflecting all other wavelengths. The filter mirrors $M(\lambda_1) \ldots M(\lambda_N)$ cover a 1×N array 206 of apertures $B_1 \ldots B_N$.

Plate C also has a corresponding array 208 of apertures, $C_1 \ldots C_N$ as shown in the figure. Additionally, Plates A, B, and C are made of a light absorbing material, as indicated by the shaded sections in the figure.

Plate D has a corresponding array 210 of retroreflectors $R(\lambda_1) \ldots R(\lambda_N)$, wherein activation of $R(\lambda_n)$ will cause light of the wavelength $\lambda_n$, to be coupled back through the laser, as will be illustrated below.

FIG. 2 illustrates activation of $R(\lambda_2)$ to provide retro reflection for completing the laser cavity at a wavelength $\lambda_2$. The collimated light from the aperture 200 falls upon narrow band pass filter mirror $M(\lambda_1)$. The transmission wavelength of this narrow band filter is chosen to be at a wavelength $\lambda_1$, which is one of the wavelengths used by the transmission system. Light at $\lambda_1$, if present will be transmitted through the filter, the aperture $B_1$, the aperture $C_1$, and fall upon the retroreflector $R(\lambda_1)$. As shown in the figure, $R(\lambda_1)$ is not activated, and thus the light that is reflected from $R(\lambda_1)$ will be blocked by the absorbing plate C as shown. It should be understood that the system components, including plates, apertures, reflectors, and mirror elements are appropriately aligned for the light to follow the path as described.

The filter mirrors M ($\lambda_1, \lambda_2, \ldots \lambda_n$) are designed so that all of the light that is not transmitted through the narrow band of frequencies $\lambda_1, \lambda_2, \ldots \lambda_n$, respectively, experiences high reflection. Thus, light not transmitted through $M(\lambda_1)$, corresponding to all the other ITU frequencies, $\lambda_2, \ldots \lambda_n$, will be reflected back up to the mirror $R_2$ and reflected to impinge upon $M(\lambda_2)$. If radiation at $\lambda_2$ is present, it will be transmitted through the narrow band filter $M(\lambda_2)$, the aperture $B_2$, the aperture $C_2$ and fall upon the retroreflector $R(\lambda_2)$. This retroreflector has been activated by angling it such that the light will be reflected through the aperture $C_2$, and thus acts as a retroreflector for the radiation at $\lambda_2$ retracing its path through aperture $C_2$, aperture $B_2$, filter mirror $M(\lambda_2)$, reflecting from mirror $R_2$, filter mirror $M(\lambda_1)$ which is high transmission at $\lambda_1$ but high reflectivity at all other wavelengths including $\lambda_2$, through the aperture 200, back into the semiconductor laser chip 102 through its antireflection coated surface.

Thus, the semiconductor laser cavity is complete at $\lambda_2$, causing the laser output at the precise ITU wavelength $\lambda_2$. It is worth noting that other wavelengths which are reflected by the filter mirror $M(\lambda_2)$ will not return to the laser and will eventually be absorbed, because their respective retroreflectors are not activated as seen in FIG. 2.

Figure 3:
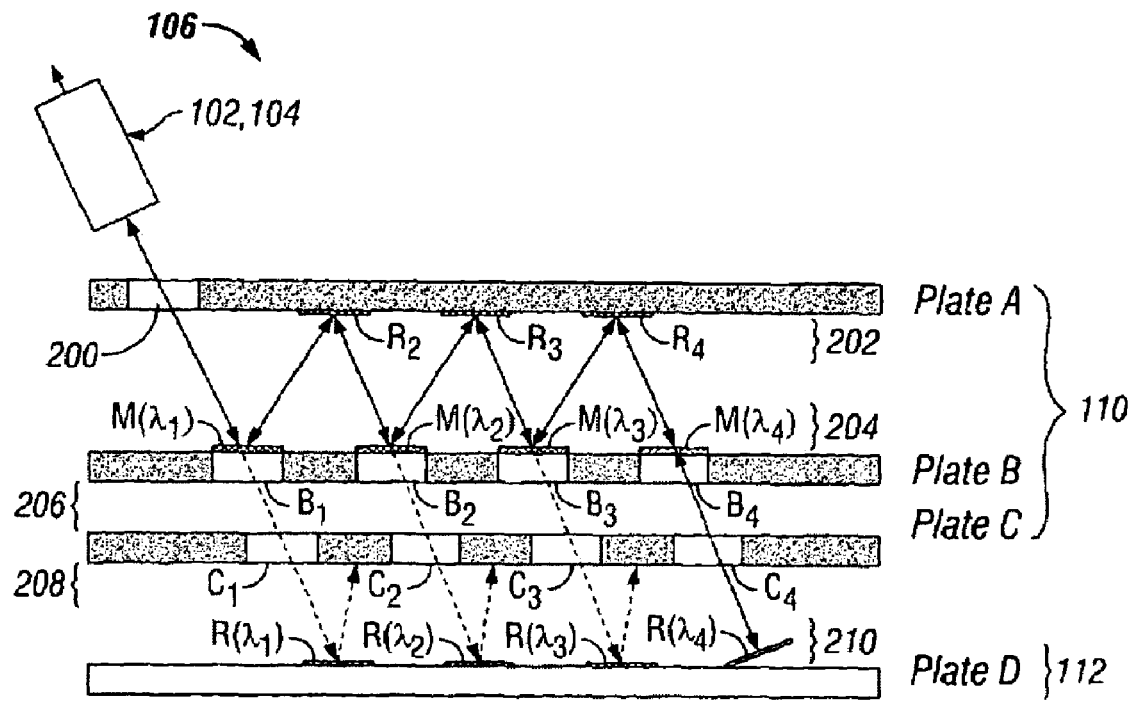
FIG. 3 schematically illustrates the operation of a wavelength selection element according to another embodiment of the present invention, whereby a retroreflector R ($\lambda_4$) of the wavelength selection element is in an activated position.

To change the wavelength of the laser to another of the ITU wavelengths, say $\lambda_4$, the retroreflector $R$ ($\lambda_4$) can be activated, as shown in FIG. 3. This completes the optical cavity resonance path for $\lambda_4$ and the laser output occurs precisely on the ITU wavelength $\lambda_4$.

Thus, through software control alone, the laser can be made to operate at any of the set wavelengths for which the filter mirrors $M(\lambda_n)$ are mounted on Plate B. Precision of the laser operating wavelengths is determined by the filter mirrors $M(\lambda_n)$, which are the same components used in constructing the multiplexers and demultiplexers for the optical transmission systems. Thus system integrity is maintained regardless of the aging of the active component, the semiconductor laser chip.

Moreover, the precision of the wavelength is not dependent on the growth vagaries of the built in gratings used in the traditional distributed feedback (DFB) lasers. In addition, this scheme reduces the cost of the lasers used in the optical communication systems. Only a single laser structure has to be fabricated for the entire DWDM system. The wavelength selection is precise and can be done locally or remotely under the program control of the system.

There are many possible variations for a wavelength selection element in accordance with the present invention. For example, Plate C may not be required as long as the apertures and retroreflectors are aligned and sized such that activation of a particular retroreflector will cause the corresponding frequency to be reflected through an open path to the laser, and other unselected frequencies to be blocked by a light absorbing element. Additionally, multiple retroreflectors may be activated for simultaneous selection of a multiple number of frequencies.

Figure 4:
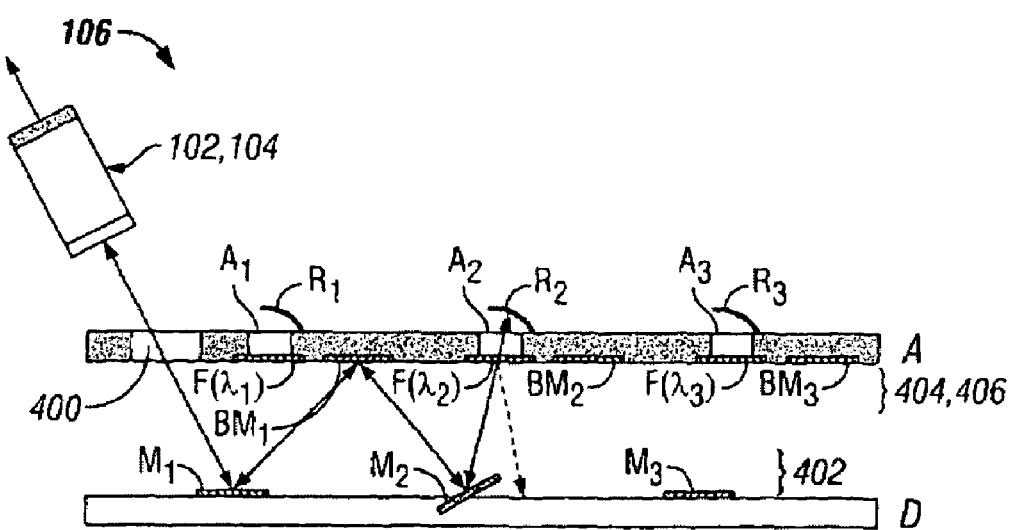
FIG. 4 schematically illustrates the operation of a wavelength selection element for selecting light of wavelength $\lambda_2$ according to an alternative embodiment of the present invention.

FIG. 4, illustrates another variation for the construction of the wavelength selection element 106, which promises low throughput losses and a simple construction. The overall architecture of the laser system is the same as that described in FIG. 1. The wavelength selection scheme now comprises only two plates (Plate "A" and Plate "D"), as shown in the figure. Plate D has a 1×N array 402 of broadband high reflectivity mirrors (MEM mirrors) $M_1$, $M_2$, $M_N$, respectively. (While the figure shows a 1×3 array for convenience of illustration, again, it should be clear that any number of selectable wavelengths can be accommodated.

Light from a semiconductor laser chip 102 is coupled into the wavelength selection components through the aperture 400 in the plate A as shown (similar to the systems of FIGS. 2 and 3). This light encounters the mirror $M_1$ which is not activated, and thus reflects the light back up towards plate A as shown. The plate A includes an 1×N array 404 of broadband high reflectivity mirrors, $BM_1$, $BM_2$, ... $BM_N$, as shown, and a 1×N array 406 of narrow transmission band filters, $F(\lambda_1)$, $F(\lambda_2)$, ... $F(\lambda_N)$ at wavelengths $\lambda_1$, $\lambda_2$, ... $\lambda_N$, which are preferably appropriate for the ITU laser frequencies for DWDM systems. These filters are mounted in front of apertures $A_1$, $A_2$ ... $A_N$ of Plate A, as shown. Behind each of apertures $A_1$, $A_2$, ... $A_N$ there is mounted a curved mirror, $R_1$, $R_2$, ... $R_N$, of appropriate curvature and broadband high reflectivity. The curved mirrors are aligned to function as retroreflectors, as will be described below.

As illustrated in FIG. 4, Mirror $M_2$ is activated to provide retro reflection from curved mirror $R_2$, through filter $F(\lambda_2)$, to complete the laser cavity at the frequency $\lambda_2$. Light coming from the semiconductor chip 102, containing all the wavelength components including wavelengths $\lambda_1$, $\lambda_2$, ... $\lambda_n$, is reflected from the unactivated mirror $M_1$ onto the fixed mirror $BM_1$. The mirror $BM_1$ reflects this light on to the MEM mirror $M_2$ that has been activated to deflect the light into filter $F(\lambda_2)$ as shown. Filter $F(\lambda_2)$ transmits only the narrow band of frequencies around $\lambda_2$ through the aperture $A_2$, incident on the curved high reflectivity mirror $R_2$ which is aligned to retroreflect the radiation back through $F(\lambda_2)$ along the same forward propagation path. All other wavelengths, other than $\lambda_2$, will not be transmitted through the filter $F(\lambda_2)$ but will be reflected as shown. These wavelengths will eventually be absorbed.

A light absorbing material may be positioned at an end of the array, either on plate A and/or as part of array D in between MEM mirrors, $M_1$ ... $M_n$, such that wavelengths which are not selected will be absorbed.

The wavelength $\lambda_2$ transmitted through $F(\lambda_2)$, reflected by $R_2$, retransmitted through $F(\lambda_2)$ traces its path back to the laser chip and completes the laser cavity that is now resonant at only $\lambda_2$. Thus, the laser will lase at the ITU wavelength $\lambda_2$ determined by the passive filter $F(\lambda_2)$ that is identical to that used in the multiplexers and demultiplexers for these sets of wavelengths.

Figure 5:
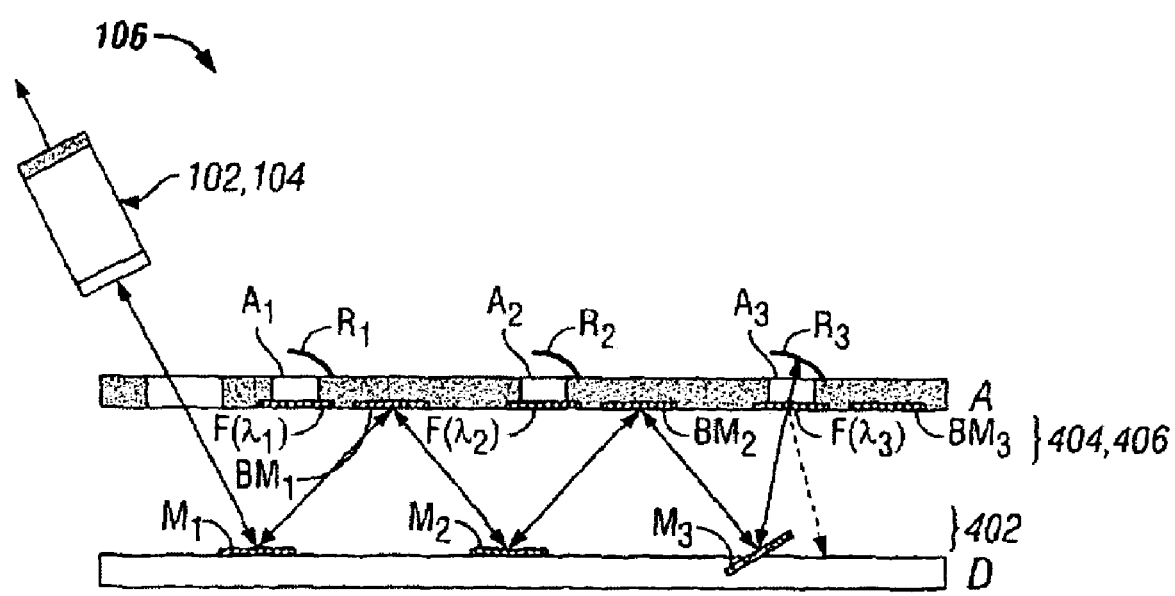
FIG. 5 illustrates the operation of a wavelength selection element for selecting light of wavelength $\lambda_3$ according to another alternative embodiment of the present invention.

To change the wavelength of the laser to another of the ITU wavelengths, say $\lambda_3$, the broadband high reflectivity MEM mirror $M_3$ is simply activated as shown in FIG. 5. This completes the optical cavity resonance path for $\lambda_3$ and the laser output occurs precisely on the ITU wavelength $\lambda_3$. It should be understood that the system components are appropriately aligned for the light to follow the path as described.

The mirrors $R_1$ ... $R_n$, which are shown to be curved, may also be flat, depending on the alignment of other components. Additionally, instead of the position switchable reflectivity mirrors or retroreflectors described in FIGS. 2-5, other elements may be used having a switchable optical property. For example, mirrors which are switchable between reflective and transmissive modes, or between reflective and light absorbing modes may be used, wherein each mirror may be optionally switched to the reflective mode for reflecting light of a desired wavelength, or to the other mode for not reflecting light which is not of a desired wavelength. Of course, other elements forming the optical path need to be aligned appropriately.

A person skilled in the art would readily appreciate that the tunable laser of the present invention may be assembled in other ways and/or with other suitable components and/or materials, as long as there is no departure from the intended purpose and scope of the present invention. The exemplary embodiments described hereinabove are merely illustrative of the general principles of the present invention. Various design modifications may be employed that would reside within the scope of the invention. Thus, by way of example, but not of limitation, alternative configurations may be utilized in accordance with the teachings herein. Accordingly, the drawings and description are illustrative and not meant to be a limitation thereof.

Moreover, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Thus, it is intended that the invention cover all embodiments and variations thereof as long as such embodiments and variations come within the scope of the appended claims and their equivalents.

What is claimed is:

1. A tunable laser, comprising:
   a semiconductor gain medium;
   a laser tuning element configured to transmit light at discrete wavelengths and reflect light of respective non-transmitted wavelengths internally;
   a laser mode matching element operatively coupled between said semiconductor gain medium and said laser tuning element; and
   a retroreflector array optically aligned with said laser tuning element, said laser tuning element being adapted to output light of a selected wavelength and absorb light of all other wavelengths upon activation of a corresponding retroreflector, said selected wavelength light output being coupled back to said semiconductor gain medium via said laser mode matching element.

2. A tunable semiconductor laser, comprising:
   a gain medium;
   a wavelength-selective element; and
   a laser mode matching element operatively coupled between said gain medium and said wavelength-selective element, said wavelength-selective element comprising:
   a first light absorbing plate operatively coupled to said laser mode matching element and provided with an array of high reflectivity mirrors, said high reflectivity mirror array facing away from said laser mode matching element;
   a second light absorbing plate with an array of narrow band pass filter mirrors operatively coupled to said high reflectivity mirror array of said first light absorbing plate, said narrow band pass filter mirror array being disposed over a respective array of apertures in said second light absorbing plate, each of said narrow band pass filter mirrors being adapted to transmit light of a particular wavelength and reflect light of all other wavelengths;
   a light reflective plate with an array of retroreflectors, each of said retroreflectors being capable of activation; and
   a third light absorbing plate with an array of apertures operatively disposed between said aperture array of said second light absorbing plate and said retroreflector array of said light reflective plate, wherein activation of a selected retroreflector results in light of a corresponding wavelength being coupled back to said gain medium through said laser mode matching element and said first, second and third light absorbing plates.

3. The tunable semiconductor laser of claim 2, wherein said gain medium is provided with first and second output faces.

4. The tunable semiconductor laser of claim 3, wherein said first output face is provided with an anti-reflection (AR) coating.

5. The tunable semiconductor laser of claim 3, wherein said second output face is provided with a partially reflective multilayer coating.

6. The tunable semiconductor laser of claim 4, wherein said laser mode matching element is operatively coupled between said first AR-coated output face of said gain medium and said first light absorbing plate of said wavelength-selective element.

7. The tunable semiconductor laser of claim 6, wherein said laser mode matching element produces collimated beam output.

8. The tunable semiconductor laser of claim 7, wherein said first light absorbing plate is provided with an aperture for coupling the collimated beam output from said laser mode matching element.

9. The tunable semiconductor laser of claim 7, wherein said first, second and third light absorbing plates are substantially parallel.

10. The tunable semiconductor laser of claim 9, wherein each of said first, second and third light absorbing plates has a substantially flat configuration.

11. The tunable semiconductor laser of claim 2, wherein said retroreflector array includes high reflectivity micro-electro-mechanical (MEM) mirrors suitable for broadband signal transmission.

12. The tunable semiconductor laser of claim 2, wherein said high reflectivity mirror array of said first light absorbing plate is suitable for broadband signal transmission.

13. The tunable semiconductor laser of claim 2, wherein said light reflective plate and said first, second and third light absorbing plates are optically aligned.

14. The tunable semiconductor laser of claim 5, further comprising a laser cavity being defined between said second partially reflective output face of said gain medium and said light reflective plate.

15. The tunable semiconductor laser of claim 2, wherein activation of said retroreflector array is software-controlled.

16. The tunable semiconductor laser of claim 2, wherein each of said narrow band pass filter mirrors is usable in construction of multiplexers and demultiplexers for optical transmission systems.

17. The tunable semiconductor laser of claim 2, wherein laser operating wavelength precision is substantially determined by said narrow band pass filter mirrors.

18. The tunable semiconductor laser of claim 14, wherein activation of a particular retroreflector completes the laser cavity resonance path for a light beam of a corresponding wavelength.

19. The tunable semiconductor laser of claim 18, wherein laser beam output from said second partially reflective output face of said gain medium occurs precisely at said corresponding wavelength.

20. The tunable semiconductor laser of claim 19, wherein said gain medium is configured as a semiconductor laser chip.

21. The tunable semiconductor laser of claim 20, wherein said semiconductor laser chip is adapted for use in broadband communication systems.

22. A tunable laser, comprising:
    a semiconductor gain medium;
    a first light absorbing plate with an array of high reflectivity mirrors;
    a second light absorbing plate with an array of narrow band pass filter mirrors operatively coupled to said high reflectivity mirror array and disposed over a respective array of apertures in said second light absorbing plate, each of said narrow band pass filter mirrors being adapted to transmit light of a particular wavelength and reflect light of all other wavelengths;
    a light reflective plate with an array of retroreflectors, each of said retroreflectors being capable of activation;

a third light absorbing plate with an array of apertures operatively disposed between said aperture array of said second light absorbing plate and said retroreflector array of said light reflective plate; and a laser mode matching element operatively coupled between said semiconductor gain medium and said first, second and third light absorbing plates, wherein activation of a particular retroreflector results in light of a selected wavelength being coupled back to said semiconductor gain medium through said laser mode matching element and said first, second and third light absorbing plates.

23. The tunable laser of claim 22, wherein said high reflectivity mirror array faces away from said laser mode matching element.

24. A method for tuning a laser having a semiconductor gain medium and a laser mode matching element, said method comprising the steps of:

disposing an array of high reflectivity mirrors away from the laser mode matching element;

disposing an array of narrow band pass filter mirrors over a first array of apertures, each of said narrow band pass filter mirrors being adapted to transmit light of a particular wavelength and reflect light of all other wavelengths;

optically aligning said narrow band pass filter mirror array with said high reflectivity mirror array;

providing an array of retroreflectors, each of said retroreflectors being capable of activation;

operatively disposing a second array of apertures between said first aperture array and said retroreflector array;

optically aligning said retroreflector array with said narrow band pass filter mirror array via said first and second aperture arrays, said retroreflector array receiving light at discrete wavelengths; and activating a particular retroreflector to cause light of a selected wavelength to be coupled back to the semiconductor gain medium via the laser mode matching element, said first and second aperture arrays, said narrow band pass filter mirror array and said high reflectivity mirror array.

* * * * *